United States Patent
Park et al.

(10) Patent No.: US 11,594,560 B2
(45) Date of Patent: Feb. 28, 2023

(54) DISPLAY APPARATUS

(71) Applicant: SAMSUNG DISPLAY CO., LTD., Yongin-si (KR)

(72) Inventors: Hyanga Park, Yongin-si (KR); Kibum Kim, Yongin-si (KR); Myeonghun Song, Yongin-si (KR); Jongchan Lee, Yongin-si (KR); Sanghee Jang, Yongin-si (KR); Woonghee Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 283 days.

(21) Appl. No.: 16/940,561

(22) Filed: Jul. 28, 2020

(65) Prior Publication Data

US 2021/0193698 A1 Jun. 24, 2021

(30) Foreign Application Priority Data

Dec. 20, 2019 (KR) ........................ 10-2019-0171893

(51) Int. Cl.
*H01L 27/12* (2006.01)
*H01L 27/32* (2006.01)
*H01L 51/50* (2006.01)

(52) U.S. Cl.
CPC ...... *H01L 27/1244* (2013.01); *H01L 27/3276* (2013.01)

(58) Field of Classification Search
USPC ........................................................ 257/773
See application file for complete search history.

(56) References Cited

U.S. PATENT DOCUMENTS

| 7,028,898 B2 | 4/2006 | Chang |
| 7,463,230 B2 | 12/2008 | Lee |
| 7,714,815 B2 | 5/2010 | Kim et al. |
| 10,096,594 B2 | 10/2018 | Chung |
| 2017/0176804 A1* | 6/2017 | Choi ...................... H05K 1/113 |

(Continued)

FOREIGN PATENT DOCUMENTS

| KR | 1020050062692 A | 6/2005 |
| KR | 100604053 B1 | 7/2006 |

(Continued)

OTHER PUBLICATIONS

Extended European Search Report for application No. 20202518.5 dated Apr. 12, 2021, citing the above reference(s).

*Primary Examiner* — Fazli Erdem
(74) *Attorney, Agent, or Firm* — Cantor Colburn LLP

(57) ABSTRACT

A display apparatus includes a substrate including a display area and a non-display area disposed around the display area, a driving circuit disposed in the non-display area, a first conductive line extending in a first direction and disposed in the non-display area, a second conductive line extending in the first direction and disposed on the first conductive line, and a third conductive line extending in the first direction and disposed on the second conductive line, wherein the second conductive line overlaps the first conductive line by a first width or is spaced apart from the first conductive line by a first distance in a plan view, and the third conductive line overlaps the first conductive line by a second width or is spaced apart from the first conductive line by a second distance in the plan view.

19 Claims, 10 Drawing Sheets

(56) References Cited

U.S. PATENT DOCUMENTS

2017/0309651 A1* 10/2017 Kim .................... G02F 1/1345
2020/0312926 A1   10/2020 Bae et al.

FOREIGN PATENT DOCUMENTS

| KR | 101034717 B1    | 5/2011  |
| KR | 1020170027901 A | 3/2017  |
| KR | 1020200115888 A | 10/2020 |

* cited by examiner

DISPLAY APPARATUS

This application claims priority to Korean Patent Application No. 10-2019-0171893, filed on Dec. 20, 2019, and all the benefits accruing therefrom under 35 U.S.C. § 119, the content of which in its entirety is herein incorporated by reference.

BACKGROUND

1. Field

Exemplary embodiments relate to display apparatuses, and more particularly, to display apparatuses with improved reliability.

2. Description of Related Art

From among display apparatuses, organic light emitting display apparatuses have attracted attention as next-generation display apparatuses due to advantages such as wide viewing angles, excellent contrast, and fast response times.

An organic light emitting display apparatus includes a display device and a driving circuit for controlling an electrical signal applied to the display device. The driving circuit is connected to a thin film transistor and a storage capacitor through a plurality of lines.

The resolution of display apparatuses has gradually increased and research has been actively conducted to rapidly drive high-resolution display apparatuses.

SUMMARY

In display apparatus of the related art, a short circuit occurs because a metal layer remains in a form of a residual layer in a groove that is defined in an insulating layer due to a step between conductive lines.

In order to solve several problems including the above problems, exemplary embodiments include preventing a short circuit occurring because a metal film remains in the form of a residual layer in a groove defined in an insulating layer. However, these problems are merely examples and the scope of the invention is not limited thereto.

Additional features will be set forth in part in the description which follows and, in part, will be apparent from the description, or may be learned by practice of the presented embodiments.

An exemplary embodiment of a display apparatus includes a substrate including a display area and a non-display area disposed around the display area, a driving circuit disposed in the non-display area, a first conductive line extending in a first direction and disposed in the non-display area, a second conductive line extending in the first direction and disposed on the first conductive line, and a third conductive line extending in the first direction and disposed on the second conductive line, wherein the second conductive line overlaps the first conductive line by a first width or is spaced apart from the first conductive line by a first distance in a plan view, and the third conductive line overlaps the first conductive line by a second width or is spaced apart from the first conductive line by a second distance in the plan view.

In an exemplary embodiment, the semiconductor substrate may further include a fourth conductive line extending in the first direction and disposed on the third conductive line, wherein the fourth conductive line may overlap the second conductive line by a third width or may be spaced apart from the second conductive line by a third distance.

In an exemplary embodiment, the first width, the second width, and the third width may be equal to or greater than about 1 micrometer ($\mu m$).

In an exemplary embodiment, the first distance, the second distance, and the third distance may be equal to or greater than about 0.75 $\mu m$ and equal to or less than about 1 $\mu m$.

In an exemplary embodiment, further including a fifth conductive line extending in a second direction intersecting the first direction and disposed on the fourth conductive line, wherein the fifth conductive line may at least partially overlap the first conductive line, the second conductive line, the third conductive line, and the fourth conductive line.

In an exemplary embodiment, the driving circuit may include a first sub driving circuit, a second sub driving circuit, a third sub driving circuit, and a fourth sub driving circuit, and the first sub driving circuit, the second sub driving circuit, the third sub driving circuit, and the fourth sub driving circuit may be spaced apart from each other in the first direction.

In an exemplary embodiment, the fifth conductive line may include a plurality of fifth conductive lines and each of the plurality of fifth conductive lines may be spaced apart from the first sub driving circuit, the second sub driving circuit, the third sub driving circuit, and the fourth sub driving circuit in the first direction.

In an exemplary embodiment, the first conductive line may be electrically connected to the second sub driving circuit.

In an exemplary embodiment, the second conductive line may connect the second sub driving circuit to the third sub driving circuit.

In an exemplary embodiment, the third conductive line may connect the second sub driving circuit to the fourth sub driving circuit.

In an exemplary embodiment, the fourth conductive line may be electrically connected to the first sub driving circuit.

In an exemplary embodiment, the display apparatus may further include a first insulating layer disposed between the first conductive line and the second conductive line, a second insulating layer disposed between the second conductive line and the third conductive line, a third insulating layer disposed between the third conductive line and the fourth conductive line, and an a fourth insulating layer disposed between the fourth conductive line and the fifth conductive line.

In an exemplary embodiment, the display apparatus may further include a planarization layer disposed on the fifth conductive line.

In an exemplary embodiment, the display apparatus may further include pixels arranged in the display area, wherein the first conductive line and the fourth conductive line may transmit at least one of a scan signal, a previous scan signal, an emission control signal, and an initialization voltage to the pixels.

An exemplary embodiment of a display apparatus includes a substrate including a display area and a non-display area disposed around the display area, a driving circuit disposed in the non-display area, a first conductive line extending in a first direction and disposed in the non-display area, a second conductive line extending in the first direction and disposed on the first conductive line, a third conductive line extending in the first direction and disposed on the second conductive line, a fourth conductive line extending in the first direction and disposed on the third conductive line, and a fifth conductive line extending in a second direction intersecting the first direction and disposed on the fourth conductive line.

In an exemplary embodiment, the fifth conductive line may at least partially overlap the first conductive line, the second conductive line, the third conductive line, and the fourth conductive line.

In an exemplary embodiment, the second conductive line may include a first bypass line and a second bypass line both extending by a first length in the second direction and a third bypass line connecting the first bypass line to the second bypass line.

In an exemplary embodiment, the third conductive line may include a fourth bypass line and a fifth bypass line both extending by a second length in the second direction and a sixth bypass line connecting the fourth bypass line to the fifth bypass line, and the second length may be smaller than the first length.

In an exemplary embodiment, the third bypass line and the sixth bypass line may at least partially overlap the fifth conductive line.

In an exemplary embodiment, the third bypass line may overlap the first conductive line by a first width and the sixth bypass line may be spaced apart from the first conductive line by a first distance.

Other features and advantages other than those described above will become apparent from the following detailed description, the appended claims, and the accompanying drawings.

BRIEF DESCRIPTION OF THE DRAWINGS

The above and other features, and advantages of exemplary embodiments will be more apparent from the following description taken in conjunction with the accompanying drawings, in which.

DETAILED DESCRIPTION

Figure 1:
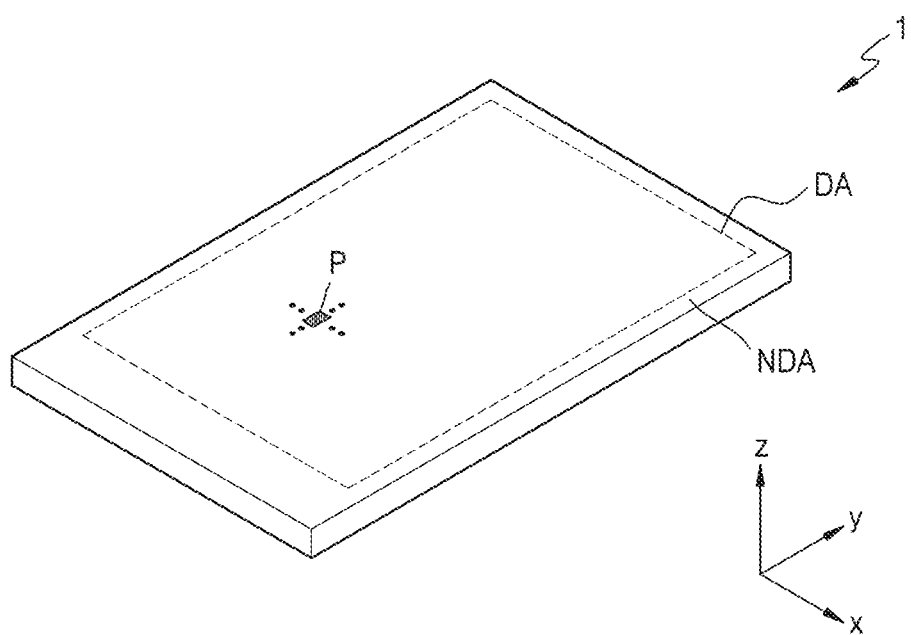
FIG. 1 is a perspective view schematically illustrating an exemplary embodiment of a display apparatus.

Reference will now be made in detail to embodiments, examples of which are illustrated in the accompanying drawings, wherein like reference numerals refer to like elements throughout. In this regard, the illustrated exemplary embodiments may have different forms and should not be construed as being limited to the descriptions set forth herein. Accordingly, the exemplary embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments will be described in detail with reference to the accompanying drawings, and in the following description, like reference numerals will denote like elements and redundant descriptions thereof will be omitted.

It will be understood that although terms such as "first" and "second" may be used herein to describe various components, these components should not be limited by these terms and these terms are only used to distinguish one component from another component. Also, as used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components. Also, it will be understood that when a layer, region, or component is referred to as being "disposed on" another layer, region, or component, it may be "directly" or "indirectly" disposed on the other layer, region, or component, that is, for example, one or more intervening layers, regions, or components may be disposed therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

Sizes of components in the drawings may be exaggerated for convenience of description. In other words, because the sizes and thicknesses of components in the drawings are arbitrarily illustrated for convenience of description, the invention is not limited thereto.

The x-axis, the y-axis, and the z-axis are not limited to three axes of the rectangular coordinate system and may be interpreted in a broader sense. The x axis, the y axis, and the z axis may be perpendicular to each other, or may represent different directions that are not perpendicular to each other, for example.

When an exemplary embodiment may be implemented differently, a particular process order may be performed differently from the described order. Two consecutively described processes may be performed substantially at the same time or performed in an order opposite to the described order, for example.

FIG. 1 is a perspective view schematically illustrating an exemplary embodiment of a display apparatus.

Referring to FIG. 1, a display apparatus 1 may include a display area DA and a non-display area NDA adjacent to the display area DA. The non-display area NDA may surround the display area DA. The display apparatus 1 may provide an image by light emitted from a plurality of pixels P arranged in the display area DA, and the non-display area NDA may be an area where no image is displayed.

Hereinafter, although an organic light emitting display apparatus is described as an example of the display apparatus 1 in an exemplary embodiment, the display apparatus of the invention is not limited thereto. In an exemplary embodiment, the display apparatus 1 of the invention may be an inorganic light emitting display apparatus (or an inorganic electroluminescence display apparatus) or may be a display apparatus such as a quantum dot light emitting display apparatus. In an exemplary embodiment, an emission layer of a display element included in the display apparatus 1 may include an organic material, may include an inorganic material, may include quantum dots, may include an organic material and quantum dots, or may include an inorganic material and quantum dots, for example.

Although FIG. 1 illustrates the display apparatus 1 including a flat display surface, the invention is not limited thereto. In an exemplary embodiment, the display apparatus 1 may include a three-dimensional display surface or a curved display surface.

When the display apparatus 1 includes a three-dimensional display surface, the display apparatus 1 may include a plurality of display areas indicating different directions and may include, for example, a polygonal columnar display surface. In an exemplary embodiment, when the display apparatus 1 includes a curved display surface, the display apparatus 1 may be implemented in various forms such as flexible, foldable, and rollable display apparatuses.

FIG. 1 illustrates the display apparatus 1 that may be applied to a mobile phone terminal. Although not illustrated, a mobile phone terminal may be constructed by arranging electronic modules, a camera module, a power module, and the like disposed (e.g., mounted) on a main board, in a bracket/case or the like together with the display apparatus 1. The display apparatus 1 according to the invention may be applied to large electronic apparatuses such as televisions or monitors and small and medium electronic apparatuses such as tablets, car navigations, game machines, or smart watches.

Although FIG. 1 illustrates a case where the display area DA of the display apparatus 1 is quadrangle, the shape of the display area DA may also be circular, elliptical, or polygonal such as triangular or pentagonal.

Figure 2:
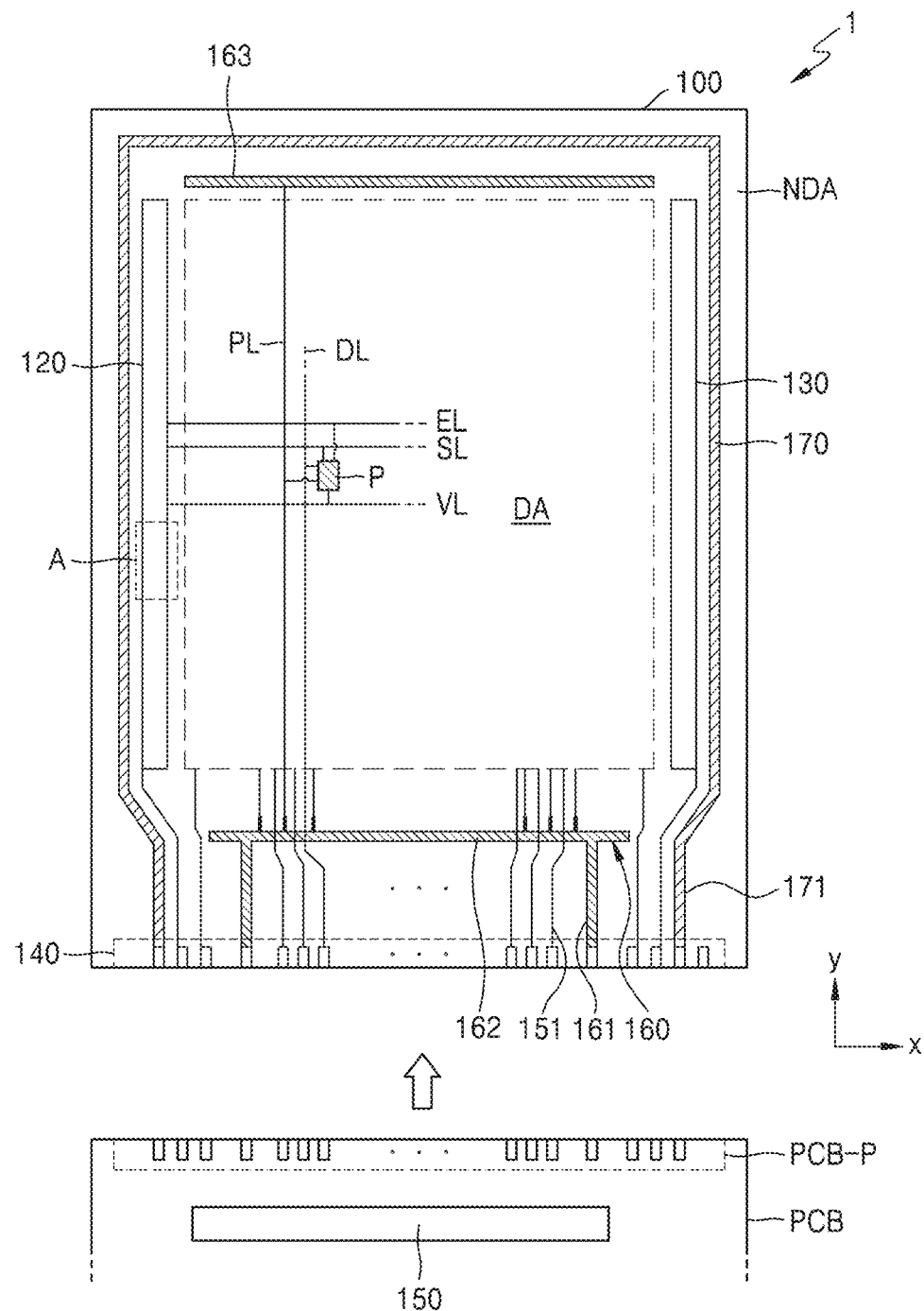
FIG. 2 is a plan view schematically illustrating an exemplary embodiment of a display apparatus.

FIG. 2 is a plan view schematically illustrating an exemplary embodiment of a portion of a display apparatus.

Referring to FIG. 2, the display apparatus 1 may include a plurality of pixels P arranged in the display area DA. Each of the pixels P may include a display element such as an organic light emitting diode OLED. Each pixel P may emit, for example, red, green, blue, or white light from the organic light emitting diode OLED. As described above, herein, the pixel P may emit any one of red light, green light, blue light, and white light. However, the invention is not limited thereto, and the pixel P may emit various other color lights. The display area DA may be covered with a thin film encapsulation layer to be protected from external air or moisture.

Each pixel P may be electrically connected to peripheral circuits arranged in a non-display area NDA. A first driving circuit 120, a second driving circuit 130, a terminal 140, a data driving circuit 150, a first power supply line 160, and a second power supply line 170 may be arranged in the non-display area NDA.

The first driving circuit 120 and the second driving circuit 130 may be arranged in the non-display area NDA. The first driving circuit 120 and the second driving circuit 130 may provide a scan signal to each pixel P through a scan line SL, may provide an emission control signal to each pixel P through an emission control line EL, and may provide an initialization voltage to each pixel P through an initialization voltage line VL. The first driving circuit 120 and the second driving circuit 130 may be arranged in parallel with the display area DA therebetween. Some of the pixels P arranged in the display area DA may be electrically connected to the first driving circuit 120 disposed on the left side of the display area DA, and the other pixels P may be electrically connected to the second driving circuit 130 disposed on the right side of the display area DA. In an exemplary embodiment, the second driving circuit 130 disposed on the right side of the display area DA may be omitted.

The terminal 140 may be disposed at one side of a substrate 100. The terminal 140 may be exposed, by not being covered by an insulating layer, and be electrically connected to a printed circuit board PCB. A terminal PCB-P of the printed circuit board PCB may be electrically connected to the terminal 140 of the display apparatus 1. The printed circuit board PCB may transmit power or signals of a controller (not illustrated) to the display apparatus 1.

A control signal generated by the controller may be transmitted to each of the first and second driving circuits 120 and 130 through the printed circuit board PCB. The controller may provide first and second power voltages to the first and second power supply lines 160 and 170 through first and second connection lines 161 and 171, respectively. A first power voltage ELVDD (refer to FIG. 3) may be provided to each pixel P through a driving voltage line PL connected to the first power supply line 160, and a second power voltage ELVSS (refer to FIG. 3) may be provided to an opposite electrode of each pixel P connected to the second power supply line 170.

The data driving circuit 150 may be electrically connected to a data line DL. A data signal of the data driving circuit 150 may be provided to each pixel P through a connection line 151 connected to the terminal 140 and a data line DL connected to the connection line 151. FIG. 2 illustrates that the data driving circuit 150 is disposed on the printed circuit board PCB, however, in an exemplary embodiment, the data driving circuit 150 may be disposed on the substrate 100. In an exemplary embodiment, the data driving circuit 150 may be disposed between the terminal 140 and the first power supply line 160, for example.

The first power supply line 160 may include a first subline 162 and a second subline 163 extending in parallel in a first direction (x direction) with the display area DA therebetween. The second power supply line 170 may partially surround the display area DA in a loop shape with one side (e.g., lower side) open.

Figure 3:
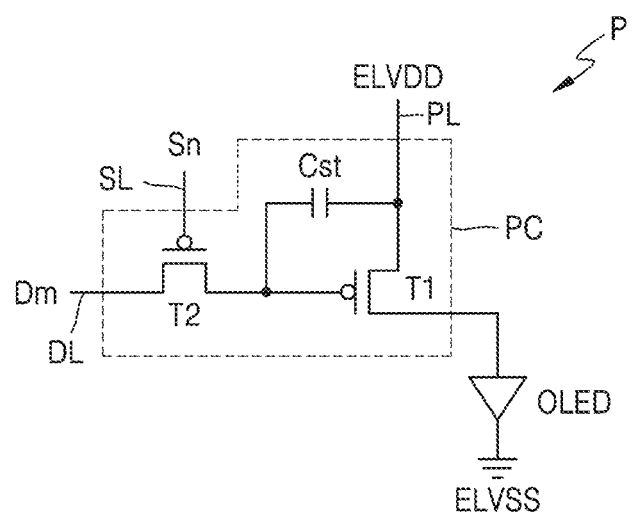
FIG. 3 is an equivalent circuit diagram of an exemplary embodiment of a pixel that may be included in a display apparatus.

FIG. 3 is an equivalent circuit diagram of an exemplary embodiment of a pixel that may be included in a display apparatus.

Figure 6:
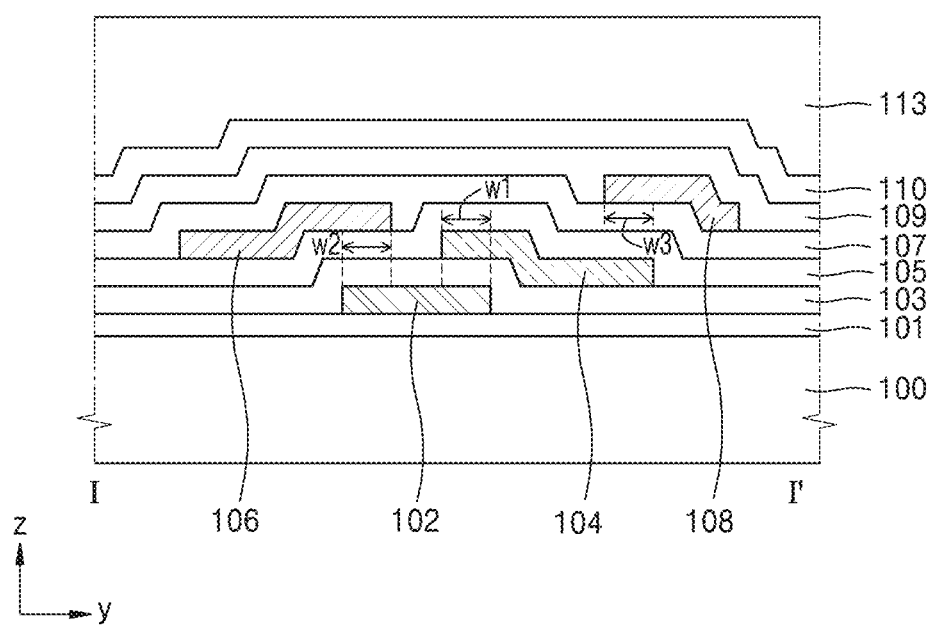
FIG. 6 is a cross-sectional view schematically illustrating an exemplary embodiment of a display apparatus.

Referring to FIGS. 3 and 6, each pixel P may include a pixel circuit PC connected to a scan line SL and a data line DL and an organic light emitting diode OLED connected to the pixel circuit PC. The pixel circuit PC may include a driving thin film transistor ("TFT") T1, a switching TFT T2, and a storage capacitor Cst. The switching TFT T2 may be connected to the scan line SL and the data line DL and may transmit a data signal Dm input through the data line DL to the driving TFT T1 according to a scan signal Sn input through the scan line SL where n and m are natural numbers.

The storage capacitor Cst may be connected to the switching TFT T2 and the driving voltage line PL and may store a voltage corresponding to the difference between the voltage received from the switching TFT T2 and the first power voltage ELVDD (or driving voltage) supplied to the driving voltage line PL.

The driving TFT T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a predetermined brightness according to the driving current.

Although FIG. 3 illustrates that the pixel circuit PC includes two TFTs and one storage capacitor, the invention is not limited thereto. In an exemplary embodiment, the display apparatus may include five TFTs and two storage capacitors, for example.

Each pixel P in an exemplary embodiment may include an organic light emitting diode OLED connected to the pixel circuit PC. The organic light emitting diode OLED may include a pixel electrode, an opposite electrode, and an intermediate layer arranged between the pixel electrode and the opposite electrode.

The pixel electrode may include a reflective layer including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or any combination thereof and a transparent or semitransparent electrode layer disposed on the reflective layer. The transparent or semitransparent electrode layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). The pixel electrode may be provided in a stack structure of ITO/Ag/ITO.

The intermediate layer may be disposed on the pixel electrode. The intermediate layer may include an emission layer ("EML"), and functional layers such as a hole transport layer ("HTL"), a hole injection layer ("HIL"), an electron transport layer ("ETL"), and an electron injection layer ("EIL") may optionally be further included under and over the emission layer.

The emission layer may include an organic material including a fluorescent or phosphorescent material emitting red, green, blue, or white light. The emission layer may include a low-molecular weight organic material or a high-molecular weight organic material. When the emission layer includes a low-molecular weight organic material, the intermediate layer may include a structure in which a hole injection layer, a hole transport layer, an emission layer, and an electron transport layer, an electron injection layer, and the like are stacked in a single or complex structure and the low-molecular weight organic material may include various organic materials such as copper phthalocyanine (CuPc), N,N'-di(naphthalene-1-yl)-N,N'-diphenyl-benzidine ("NPB"), and tris-8-hydroxyquinoline aluminum (Alq3). These layers may be provided by vacuum deposition.

When the emission layer includes a high-molecular weight organic material, the intermediate layer may generally have a structure including a hole transport layer and an emission layer. In this case, the hole transport layer may include poly(3,4-ethylenedioxythiophene) ("PEDOT") and the emission layer may include a high-molecular weight material such as poly-phenylene vinylene ("PPV") and polyfluorene. The emission layer may be provided by screen printing, inkjet printing, laser induced thermal imaging ("LITI"), or the like.

The opposite electrode may be disposed on the intermediate layer. The opposite electrode may be disposed on the intermediate layer to cover the entirety of the intermediate layer. The opposite electrode may be disposed over the display area DA to cover the entirety of the display area DA. That is, the opposite electrode may be unitary to cover a plurality of pixels P arranged in the display area DA. The opposite electrode may include a conductive material having a low work function. In an exemplary embodiment, the opposite electrode may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof, for example. In an alternative exemplary embodiment, the opposite electrode may further include a layer such as ITO, IZO, ZnO, or $In_2O_3$ on the (semi)transparent layer including the above material.

Figure 4:
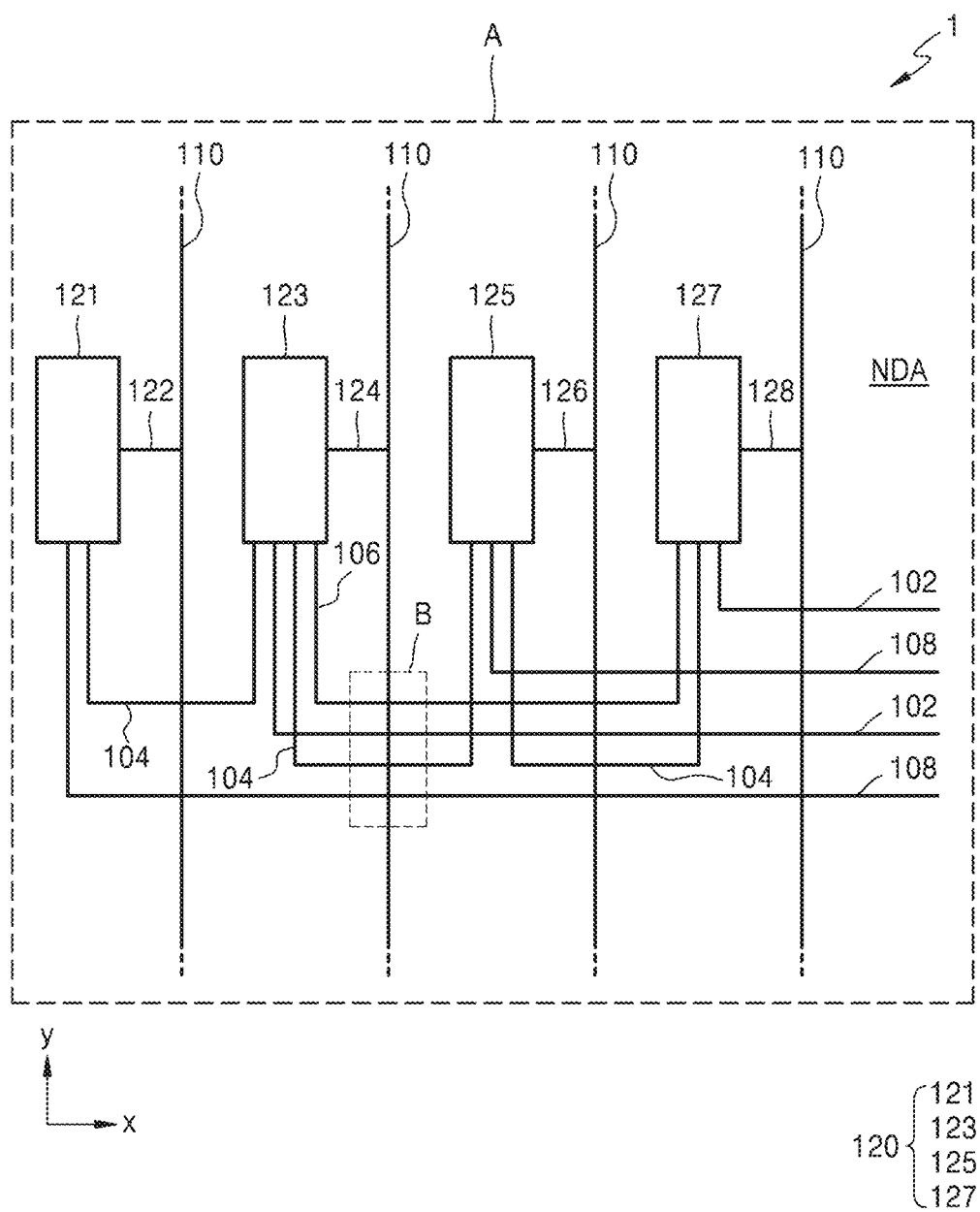
FIG. 4 is a plan view schematically illustrating an exemplary embodiment of a display apparatus.

FIG. 4 is a plan view schematically illustrating an exemplary embodiment of a display apparatus. More particularly, FIG. 4 corresponds to an enlarged plan view of a portion A of the first driving circuit 120 of FIG. 2.

Referring to FIG. 4, a first driving circuit 120, a first conductive line 102, a second conductive line 104, a third conductive line 106, a fourth conductive line 108, and a fifth conductive line 110 may be arranged in the non-display area NDA. The first conductive line 102, the second conductive line 104, the third conductive line 106, the fourth conductive line 108, and the fifth conductive line 110 arranged in the non-display area NDA may be arranged in different layers. The first driving circuit 120 may include a first sub driving circuit 121, a second sub driving circuit 123, a third sub driving circuit 125, and a fourth sub driving circuit 127 that are spaced apart from each other in the first direction (x direction). Although FIG. 4 illustrates that the first driving circuit 120 includes four sub driving circuits 121, 123, 125, and 127, the invention is not limited thereto. In an exemplary embodiment, the first driving circuit 120 may include one sub driving circuit or may include two sub driving circuits.

The first conductive line 102 may be electrically connected to the second sub driving circuit 123 and the fourth sub driving circuit 127 to transmit at least one of a scan signal, a previous scan signal, an emission control signal, and an initialization voltage to the pixel P disposed in the display area DA.

The second conductive line 104 may electrically connect the first sub driving circuit 121 to the second sub driving circuit 123, the second sub driving circuit 123 to the third sub driving circuit 125, and the third sub driving circuit 125 to the fourth sub driving circuit 127. The first sub driving circuit 121 and the second sub driving circuit 123, the second sub driving circuit 123 and the third sub driving circuit 125, and the third sub driving circuit 125 and the fourth sub driving circuit 127 may transmit or receive a clock signal through the second conductive line 104.

The third conductive line 106 may electrically connect the second sub driving circuit 123 to the fourth sub driving circuit 127. The second sub driving circuit 123 and the fourth sub driving circuit 127 may transmit or receive a clock signal through the third conductive line 106. Although not illustrated, the first sub driving circuit 121 and the fourth sub driving circuit 127 may also be electrically connected to each other through a conductive line.

The fourth conductive line 108 may be electrically connected to the first sub driving circuit 121 and the third sub driving circuit 125 to transmit at least one of a scan signal, a previous scan signal, an emission control signal, and an initialization voltage to the pixel P disposed in the display area DA. In an exemplary embodiment, the fourth conductive line 108 and the first conductive line 102 may transmit different signals to the pixel P disposed in the display area DA.

The fifth conductive line 110 may extend in the second direction (y direction) in the non-display area NDA and may include a plurality of fifth conductive lines. The fifth conductive lines 110 may be respectively spaced apart from the first sub driving circuit 121, the second sub driving circuit 123, the third sub driving circuit 125, and the fourth sub driving circuit 127 in the first direction (x direction) intersecting the second direction (y direction). The fifth conductive lines 110 may respectively provide at least one of a gate high voltage, a gate low voltage, and a clock signal to the first sub driving circuit 121, the second sub driving circuit 123, the third sub driving circuit 125, and the fourth sub driving circuit 127 through lines 122, 124, 126, and 128 extending in the first direction (x direction). Although FIG. 4 illustrates that one fifth conductive line 110 is connected to one sub driving circuit, the invention is not limited thereto. In an exemplary embodiment, three fifth conductive lines 110 may be connected to one sub driving circuit to transmit different signals to the sub driving circuit.

Figure 5:
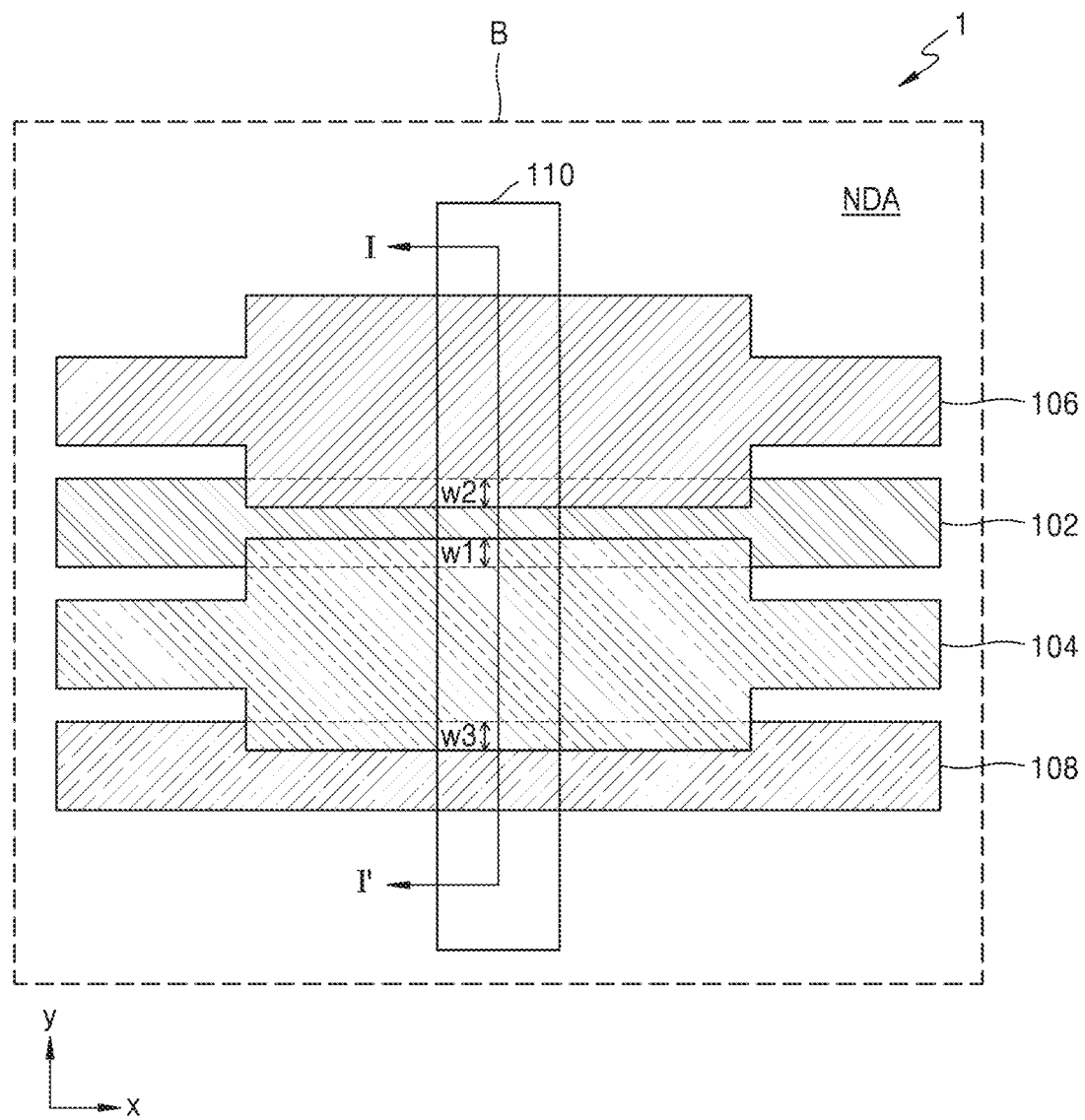
FIG. 5 is a plan view schematically illustrating an exemplary embodiment of a display apparatus.

FIG. 5 is a plan view schematically illustrating an exemplary embodiment of a display apparatus, and FIG. 6 is a cross-sectional view schematically illustrating an exemplary embodiment of a display apparatus. More particularly, FIG. 5 is an enlarged plan view of a region B of FIG. 4, and FIG. 6 corresponds to a cross-sectional view of the region B taken along line I-I' of FIG. 5. A planarization layer 113 (refer to FIG. 6) may be disposed on the fifth conductive line 110 of FIG. 5 but is omitted for convenience of illustration and description.

In the case of a display apparatus for providing a high-resolution image, as the number of driving circuits for driving the display apparatus increases, the number of conductive lines connecting the driving circuits increases, and thus the conductive lines are layered in a non-display area. However, when grooves are defined in an insulating layer due to the gap between the layered conductive lines and the gap between the grooves defined in the insulating layer is equal to or greater than about 0.25 micrometer (μm) and equal to or less than about 0.75 μm, because a metal layer remains in the form of a residual layer in the grooves, a short circuit occurs between the conductive lines.

In order to solve the above problem, according to the invention, because conductive lines overlap each other by a predetermined width or are spaced apart from each other by a predetermined distance, it may be possible to implement a display apparatus that may prevent the occurrence of a short circuit between the conductive lines and simultaneously may have improved reliability. This will be described with reference to FIGS. 5 and 6.

First, referring to FIG. 5, the display apparatus 1 in an exemplary embodiment may include a first conductive line 102 extending in a first direction (x direction) and disposed in a non-display area NDA, a second conductive line 104 extending in the first direction (x direction) and disposed on the first conductive line 102, a third conductive line 106 extending in the first direction (x direction) and disposed on the second conductive line 104, and a fourth conductive line 108 extending in the first direction (x direction) and disposed on the third conductive line 106, and a fifth conductive line 110 extending in a second direction (y direction) intersecting the first direction (x direction) and disposed on the fourth conductive line 108. The fifth conductive line 110 may at least partially overlap the first conductive line 102, the second conductive line 104, the third conductive line 106, and the fourth conductive line 108.

In an exemplary embodiment of the display apparatus 1, because the first conductive line 102, the second conductive line 104, the third conductive line 106, and the fourth conductive line extending in the first direction (x direction) are arranged in different layers, in order to prevent a short circuit from occurring between the conductive lines due to a metal layer remaining in the form of a residual layer provided in grooves with a gap equal to or greater than about 0.25 μm and equal to or less than about 0.75 μm defined in an insulating layer, the conductive lines may overlap each other by a predetermined width or may be spaced apart from each other by a predetermined distance such that the gap between the grooves defined in the insulating layer may be equal to or greater than about 0 μm and equal to or less than about 0.25 μm, or equal to or greater than about 0.75 μm and equal to or less than about 2 μm.

In an exemplary embodiment, a portion of the second conductive line 104 and a portion of the third conductive line 106 overlapping the fifth conductive line 110 may be extended in the second direction (y direction) to overlap the first conductive line 102 and the second conductive line 104 with each other by a first width w1, overlap the first conductive line 102 and the third conductive line 106 with each other by a second width w2, and overlap the second conductive line 104 and the fourth conductive line 108 with each other by a third width w3 such that the gap between the grooves defined in the insulating layer may be equal to or greater than about 0 μm and equal to or less than about 0.25 μm or equal to or greater than about 0.75 μm or and equal to or less than about 2 μm.

Referring to FIG. 6, the display apparatus in an exemplary embodiment may include a substrate 100, a first conductive line 102, a second conductive line 104, a third conductive line 106, a fourth conductive line 108, and a fifth conductive line 110 sequentially arranged on the substrate 100 and may further include a first insulating layer 103 disposed between the first conductive line 102 and the second conductive line 104, a second insulating layer 105 disposed between the second conductive line 104 and the third conductive line 106, a third insulating layer 107 disposed between the third conductive line 106 and the fourth conductive line 108, and a fourth insulating layer 109 disposed between the fourth conductive line 108 and the fifth conductive line 110.

The substrate 100 may include a glass material or a polymer resin including $SiO_2$ as a main component. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, or the like. The substrate 100 including the polymer resin may be deformable such as flexible, rollable, or bendable. The substrate 100 may have a multilayer structure including an inorganic layer (not illustrated) and a layer including the above polymer resin.

A buffer layer 101 may be disposed on the substrate 100 to reduce or block the penetration of foreign materials, moisture, or external air from the bottom of the substrate 100 and may provide a flat surface on the substrate 100. The buffer layer 101 may include an inorganic material such as oxide or nitride, an organic material, or an organic/inorganic composite and may include a single-layer or multi-layer structure of an inorganic material and an organic material. A barrier layer (not illustrated) for blocking the penetration of external air may be further included between the substrate 100 and the buffer layer 101.

The first conductive line 102 may be disposed on the buffer layer 101. In an exemplary embodiment, the first conductive line 102 may include a single layer or a multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example.

The second conductive line 104 may be disposed on the first conductive line 102. In an exemplary embodiment, the second conductive line 104 may include a single layer or a multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example. In an exemplary embodiment, the second conductive line 104 may include the same material as that of the first conductive line 102.

The second conductive line 104 may overlap the first conductive line 102 by a first width w1 in a plan view viewed in a direction perpendicular to the substrate 100. In this case, the first width w1 may be equal to or greater than about 1 µm. In an exemplary embodiment, the first width w1 may be at least one of about 0.8 µm, about 0.9 µm, about 1.1 µm, and about 1.2 µm, for example. In an exemplary embodiment, the second conductive line 104 may completely overlap the first conductive line 102, for example.

Because the first conductive line 102 and the second conductive line 104 overlap each other by the first width w1, grooves with a gap equal to or greater than about 0.25 µm and equal to or less than about 0.75 µm may be prevented from being defined in the fourth insulating layer 109.

The first insulating layer 103 may be disposed between the first conductive line 102 and the second conductive line 104. The first insulating layer 103 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 103 may include a single layer or a multiple layer including the above inorganic insulating material.

The third conductive line 106 may be disposed on the second conductive line 104. In an exemplary embodiment, the third conductive line 106 may include a single layer or a multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example. In an exemplary embodiment, the third conductive line 106 may include the same material as that of the first conductive line 102, for example.

The third conductive line 106 may overlap the first conductive line 102 by a second width w2 in the plan view. In this case, the second width w2 may be equal to or greater than about 1 µm. In an exemplary embodiment, the second width w2 may be at least one of about 0.8 µm, about 0.9 µm, about 1.1 µm, and about 1.2 µm, for example. In an exemplary embodiment, the third conductive line 106 may completely overlap the first conductive line 102, for example.

Because the first conductive line 102 and the third conductive line 106 overlap each other by the second width w2, grooves with a gap equal to or greater than about 0.25 µm and equal to or less than about 0.75 µm may be prevented from being defined in the fourth insulating layer 109.

The second insulating layer 105 may be disposed between the second conductive line 104 and the third conductive line 106. In an exemplary embodiment, the second insulating layer 105 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example. The second insulating layer 105 may include a single layer or a multiple layer including the above inorganic insulating material.

The fourth conductive line 108 may be disposed on the third conductive line 106. In an exemplary embodiment, the fourth conductive line 108 may include a single layer or a multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example. In an exemplary embodiment, the fourth conductive line 108 may include the same material as that of the first conductive line 102, for example.

The fourth conductive line 108 may overlap the second conductive line 104 by a third width w3 in the plan view. In this case, the third width w3 may be equal to or greater than about 1 µm. In an exemplary embodiment, the third width w3 may be at least one of about 0.8 µm, about 0.9 µm, about 1.1 µm, and about 1.2 µm, for example. In an exemplary embodiment, the fourth conductive line 108 may completely overlap the second conductive line 104, for example.

Because the second conductive line 104 and the fourth conductive line 108 overlap each other by the third width w3, grooves with a gap equal to or greater than about 0.25 µm and equal to or less than about 0.75 µm may be prevented from being defined in the fourth insulating layer 109.

The third insulating layer 107 may be disposed between the third conductive line 106 and the fourth conductive line 108. In an exemplary embodiment, the third insulating layer 107 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example. The third insulating layer 107 may include a single layer or a multiple layer including the above inorganic insulating material.

The fifth conductive line 110 may be disposed on the fourth conductive line 108. The fifth conductive line 110 may at least partially overlap the first conductive line 102, the second conductive line 104, the third conductive line 106, and the fourth conductive line 108 in the plan view. In an exemplary embodiment, the fifth conductive line 110 may include a single layer or a multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example. In an exemplary embodiment, the fifth conductive line 110 may include the same material as that of the first conductive line 102, for example.

The fourth insulating layer 109 may be disposed between the fourth conductive line 108 and the fifth conductive line 110. In an exemplary embodiment, the fourth insulating layer 109 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), for example. The fourth insulating layer 109 may include a single layer or a multiple layer including the above inorganic insulating material.

A planarization layer 113 may be disposed on the fifth conductive line 110. The planarization layer 113 may include a flat upper surface such that an upper conductive line disposed thereon may be provided flat.

The planarization layer 113 may include a single layer or a multiple layer including an organic material or an inorganic material. In an exemplary embodiment, the planarization layer 113 may include a general-purpose polymer such as benzocyclobutene ("BCB"), polyimide ("PI"), hexamethyldisiloxane ("HMDSO"), polymethylmethacrylate ("PMMA"), or polystyrene ("PS"), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof. In an exemplary embodiment, the planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$), for example. After the forming of the planarization layer 113, chemical mechanical polishing may be performed to provide a flat upper surface.

Although FIGS. 5 and 6 illustrate and describe the case where the first conductive line 102 and the second conductive line 104 overlap each other by the first width w1, the first conductive line 102 and the third conductive line 106 overlap each other by the second width w2, and the second conductive line 104 and the fourth conductive line 108 overlap each other by the third width w3, the invention is not limited thereto. In an exemplary embodiment, the first conductive line 102 and the second conductive line 104 may overlap each other by the first width w1 and the first conductive line 102 and the third conductive line 106 may be spaced apart from each other by a second distance d2 (refer to FIG. 8) as an example of various modifications as described below, for example.

Figure 7:
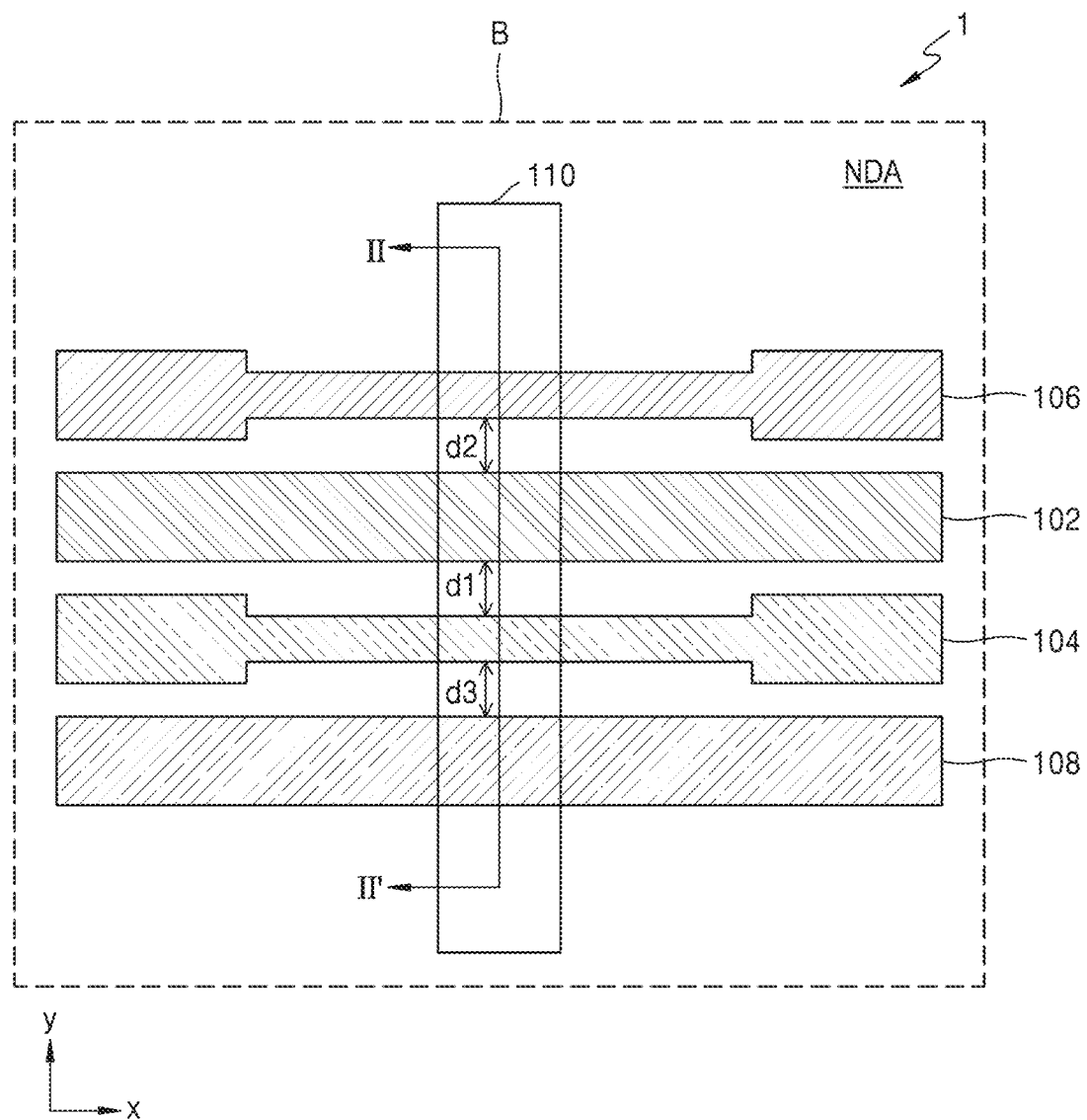
FIG. 7 is a plan view schematically illustrating an exemplary embodiment of a display apparatus.
Figure 8:
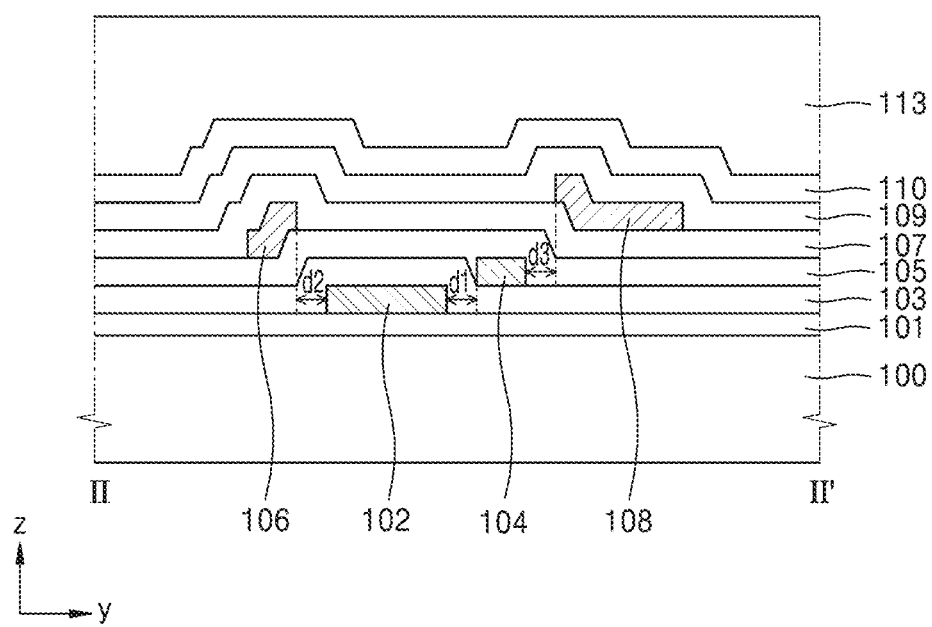
FIG. 8 is a cross-sectional view schematically illustrating an exemplary embodiment of a display apparatus.

FIG. 7 is a plan view schematically illustrating an exemplary embodiment of a display apparatus, and FIG. 8 is a cross-sectional view schematically illustrating an exemplary embodiment of a display apparatus. More particularly, FIG. 7 is an enlarged plan view of a region B of FIG. 4, and FIG. 8 corresponds to a cross-sectional view of the region B taken along line II-IP of FIG. 7. The exemplary embodiment of FIGS. 7 and 8 is different from the exemplary embodiment of FIGS. 5 and 6 in that conductive lines are spaced apart from each other in a plan view. Among the configurations of FIGS. 7 and 8, descriptions of the same configurations as those of FIGS. 5 and 6 will be omitted, and differences therebetween will be mainly described below. The planarization layer 113 may be disposed on the fifth conductive line 110 of FIG. 7 but is omitted for convenience of illustration and description.

Referring to FIG. 7, the second conductive line 104 and the third conductive line 106 of a portion overlapping the fifth conductive line 110 may be thinned in the second direction (y direction) to cause the first conductive line 102 and the second conductive line 104 to be spaced apart from each other by a first distance d1, cause the first conductive line 102 and the third conductive line 106 to be spaced apart from each other by a second distance d2, and cause the second conductive line 104 and the fourth conductive line 108 to be spaced apart from each other by a third distance d3 such that the gap between the grooves defined in the insulating layer may be equal to or greater than about 0 µm and equal to or less than about 0.25 µm, or equal to or greater than about 0.75 µm and equal to or less than about 2 µm.

Referring to FIG. 8, the second conductive line 104 may be spaced apart from the first conductive line 102 by the first distance d1 in the plan view. In this case, the first distance d1 may be equal to or greater than about 0.75 µm and equal to or less than about 1 µm. In an exemplary embodiment, the first distance d1 may be equal to or greater than about 0.6 µm and equal to or less than about 1.1 µm, equal to or greater than about 0.55 µm and equal to or less than about 1.2 µm, or equal to or greater than about 0.45 µm and about equal to or less than 1.3 µm. Because the first conductive line 102 and the second conductive line 104 are spaced apart from each other by the first distance d1, grooves with a gap equal to or greater than about 0.25 µm and equal to or less than about 0.75 µm may be prevented from being defined in the fourth insulating layer 109.

The third conductive line 106 may be spaced apart from the first conductive line 102 by the second distance d2 in the plan view. In this case, the second distance d2 may be equal to or greater than about 0.75 µm and equal to or less than about 1 µm. In an exemplary embodiment, the second distance d2 may be equal to or greater than about 0.6 µm and equal to or less than about 1.1 µm, equal to or greater than about 0.55 µm and equal to or less than about 1.2 µm, or equal to or greater than about 0.45 µm and equal to or less than about 1.3 µm. Because the first conductive line 102 and the third conductive line 106 are spaced apart from each other by the second distance d2, grooves with a gap equal to or greater than about 0.25 µm and equal to or less than about 0.75 µm may be prevented from being defined in the fourth insulating layer 109.

The fourth conductive line 108 may be spaced apart from the second conductive line 104 by the third distance d3 in the plan view. In this case, the third distance d3 may be equal to or greater than about 0.75 µm and equal to or less than about 1 µm. In an exemplary embodiment, the third distance d3 may be equal to or greater than about 0.6 µm and equal to or less than about 1.1 µm, equal to or greater than about 0.55 µm and equal to or less than about 1.2 µm, or equal to or greater than about 0.45 µm and equal to or less than about 1.3 µm. Because the second conductive line 104 and the fourth conductive line 108 are spaced apart from each other by the third distance d3, grooves with a gap equal to or greater than about 0.25 µm and equal to or less than about 0.75 µm may be prevented from being defined in the fourth insulating layer 109.

Although FIGS. 7 and 8 illustrate and describe the case where the first conductive line 102 and the second conductive line 104 are spaced apart from each other by the first distance d1, the first conductive line 102 and the third conductive line 106 are spaced apart from each other by the second distance d2, and the second conductive line 104 and the fourth conductive line 108 are spaced apart from each other by the third distance d3, the invention is not limited thereto. In an exemplary embodiment, the first conductive line 102 and the second conductive line 104 may be spaced apart from each other by the first distance d1 and the first conductive line 102 and the third conductive line 106 may overlap each other by the first width w1 (refer to FIG. 6) as an example of various modifications, for example.

Figure 9:
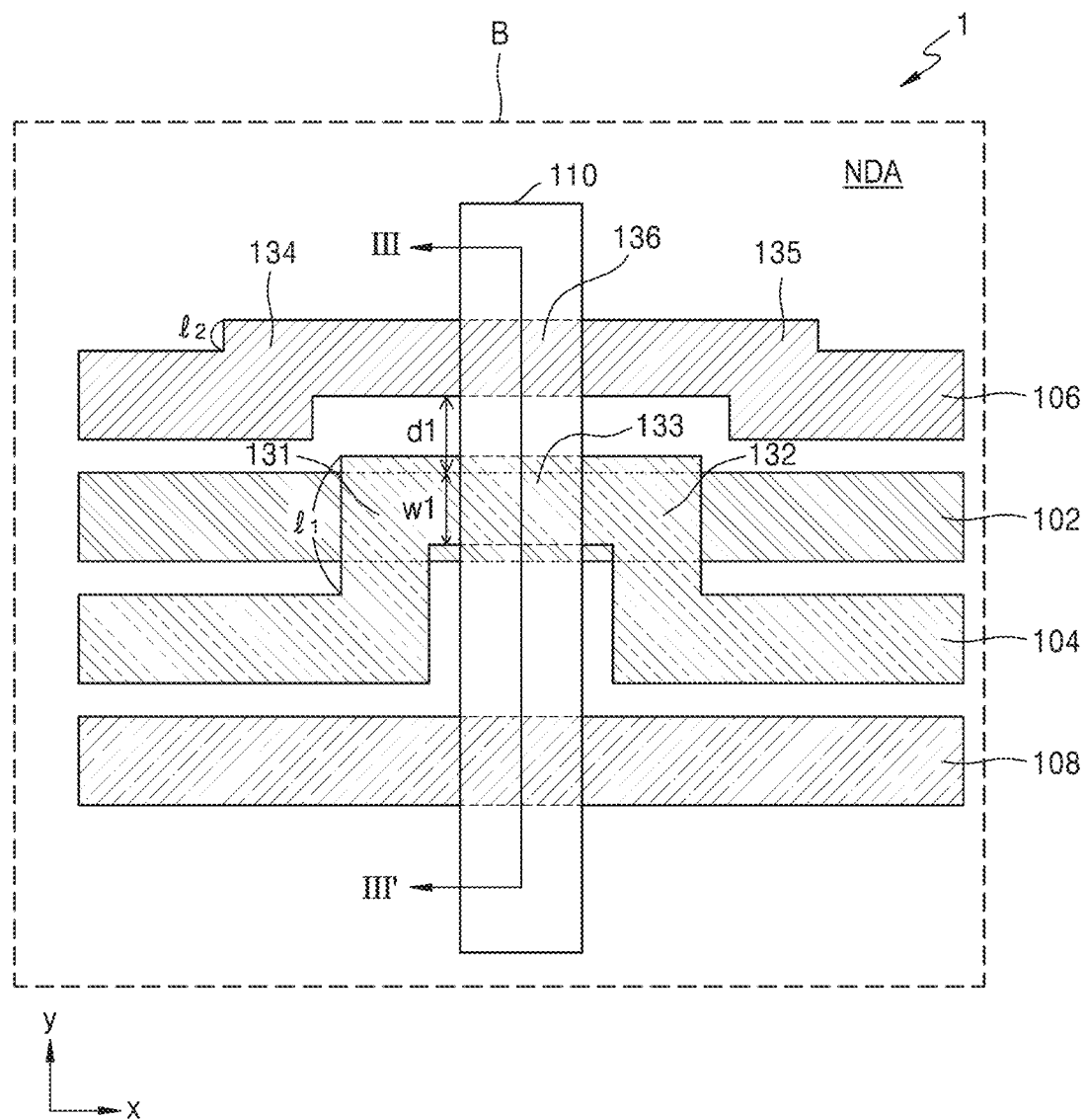
FIG. 9 is a plan view schematically illustrating an exemplary embodiment of a display apparatus.
Figure 10:
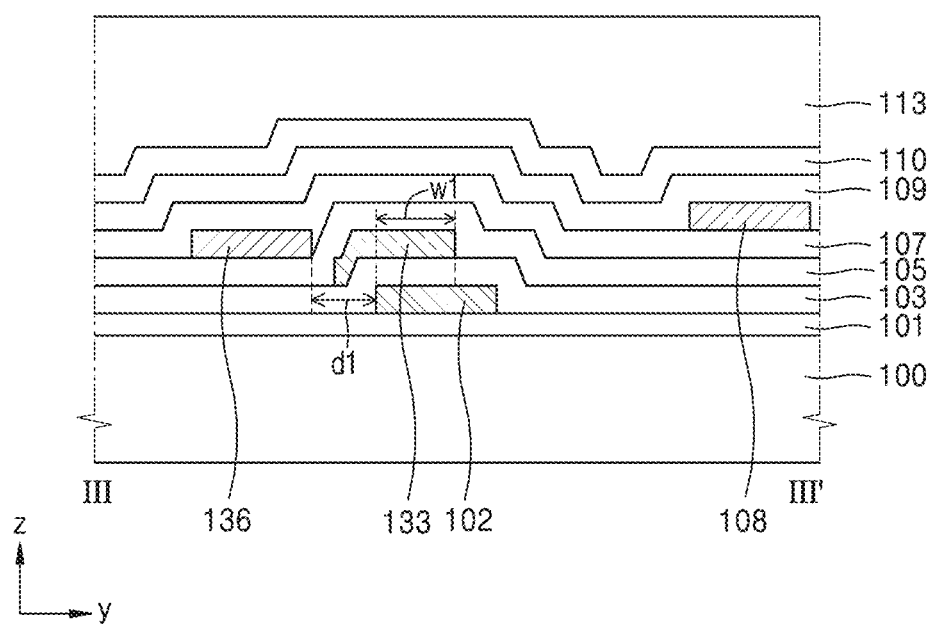
FIG. 10 is a cross-sectional view schematically illustrating an exemplary embodiment of a display apparatus.

FIG. 9 is a plan view schematically illustrating an exemplary embodiment of a display apparatus, and FIG. 10 is a cross-sectional view schematically illustrating an exemplary embodiment of a display apparatus. More particularly, FIG. 9 is an enlarged plan view of a region B of FIG. 4, and FIG. 10 corresponds to a cross-sectional view of the region B taken along line of FIG. 9. The exemplary embodiment of FIGS. 9 and 10 is different from the exemplary embodiment of FIGS. 5 and 6 in that the second conductive line 104 and the third conductive line 106 include bypass lines. Among the configurations of FIGS. 9 and 10, descriptions of the same configurations as those of FIGS. 5 and 6 will be omitted, and differences therebetween will be mainly described below. The planarization layer 113 may be disposed on the fifth conductive line 110 of FIG. 9 but is omitted for convenience of illustration and description.

Referring to FIG. 9, the second conductive line 104 may include a first bypass line 131 and a second bypass line 132 both extending by a first length l1 in the second direction (y direction), and a third bypass line 133 connecting the first bypass line 131 to the second bypass line 132. Because the second conductive line 104 includes the first bypass line 131, the second bypass line 132, and the third bypass line 133, the second conductive line 104 and the first conductive line 102 may overlap each other by the first width w1 while the width of the second conductive line 104 is maintained uniform.

The third conductive line 106 may include a fourth bypass line 134 and a fifth bypass line 135 both extending by a second length l2 in the second direction (y direction), and a sixth bypass line 136 connecting the fourth bypass line 134 to the fifth bypass line 135. Because the third conductive line 106 includes the fourth bypass line 134, the fifth bypass line 135, and the sixth bypass line 136, the third conductive line 106 and the first conductive line 102 may be spaced apart from each other by the first distance d1 while the width of the third conductive line 106 is maintained uniform. In this case, the second length l2 may be smaller than the first length l1.

The third bypass line 133 included in the second conductive line 104 and the sixth bypass line 136 included in the third conductive line 106 may overlap the fifth conductive line 110 extending in the second direction (y direction).

Referring to FIG. 10, the third bypass line 133 included in the second conductive line 104 may overlap the first conductive line 102 by the first width w1 in the plan view. In this case, the first width w1 may be about 1 μm. In an exemplary embodiment, the first width w1 may be at least one of about 0.8 μm, about 0.9 μm, about 1.1 μm, and about 1.2 μm, for example. In an exemplary embodiment, the second conductive line 104 may completely overlap the first conductive line 102, for example. Because the first conductive line 102 and the third bypass line 133 included in the second conductive line 104 overlap each other by the first width w1, grooves with a gap equal to or greater than about 0.25 μm and equal to or less than about 0.75 μm may be prevented from being defined in the fourth insulating layer 109.

The sixth bypass line 136 included in third conductive line 106 may be spaced apart from the first conductive line 102 by the first distance d1 in the plan view. In this case, the first distance d1 may be equal to or greater than about 0.75 μm and equal to or less than about 1 μm. In an exemplary embodiment, the first distance d1 may be equal to or greater than about 0.6 μm and equal to or less than about 1.1 μm, equal to or greater than about 0.55 μm and equal to or less than about 1.2 μm, and equal to or greater than about 0.45 μm and equal to or less than about 1.3 μm. Because the first conductive line 102 and the sixth bypass line 136 included in the third conductive line 106 are spaced apart from each other by the first distance d1, grooves with a gap equal to or greater than about 0.25 μm and equal to or less than about 0.75 μm may be prevented from being defined in the fourth insulating layer 109.

In order to solve the problem of a display apparatus of the related art in which a short circuit occurs because a metal layer remains in the form of a residual layer in a groove defined in an insulating layer, in an exemplary embodiment, because the conductive lines overlap each other by a predetermined width or are spaced apart from each other by a predetermined distance, it may be possible to implement a display apparatus that may prevent the occurrence of a short circuit between the conductive lines and simultaneously may have improved reliability.

According to the exemplary embodiment described above, because the conductive lines overlap each other by a predetermined width or are spaced apart from each other by a predetermined distance, it may be possible to implement a display apparatus that may prevent the occurrence of a short circuit between the conductive lines and simultaneously may have improved reliability. However, the scope of the invention is not limited to these effects.

It should be understood that embodiments described herein should be considered in a descriptive sense only and not for purposes of limitation. Descriptions of features or features within each embodiment should typically be considered as available for other similar features or features in other exemplary embodiments. While exemplary embodiments have been described with reference to the drawing figures, it will be understood by those of ordinary skill in the art that various changes in form and details may be made therein without departing from the spirit and scope of the invention.

What is claimed is:

1. A display apparatus comprising:
a substrate including a display area and a non-display area disposed around the display area;
a driving circuit disposed in the non-display area;
a first conductive line extending in a first direction and disposed in the non-display area;
a second conductive line extending in the first direction and disposed on the first conductive line;
a third conductive line extending in the first direction and disposed on the second conductive line; and
a fifth conductive line extending in a second direction intersecting the first direction and disposed on the third conductive line,
wherein the second conductive line overlaps the first conductive line by a first width or is spaced apart from the first conductive line by a first distance in a plan view,
the third conductive line overlaps the first conductive line by a second width or is spaced apart from the first conductive line by a second distance in the plan view, and
wherein the fifth conductive line extending in the second direction at least partially overlaps the first conductive line, the second conductive line, and the third conductive line all extending in the first direction.

2. The display apparatus of claim 1, further comprising a fourth conductive line extending in the first direction and disposed on the third conductive line,
wherein the fourth conductive line overlaps the second conductive line by a third width or is spaced apart from the second conductive line by a third distance.

3. The display apparatus of claim 2, wherein the first width, the second width, and the third width are equal to or greater than about 1 micrometer.

4. The display apparatus of claim 2, wherein the first distance, the second distance, and the third distance are equal to or greater than about 0.75 micrometer and equal to or less than about 1 micrometer.

5. The display apparatus of claim 2, wherein the fifth conductive line is disposed on the fourth conductive line, and wherein the fifth conductive line extending in the second direction at least partially overlaps the first conductive line, the second conductive line, the third conductive line, and the fourth conductive line all extending in the first direction.

6. The display apparatus of claim 5, wherein the driving circuit includes a first sub driving circuit, a second sub driving circuit, a third sub driving circuit, and a fourth sub driving circuit, and
the first sub driving circuit, the second sub driving circuit, the third sub driving circuit, and the fourth sub driving circuit are spaced apart from each other in the first direction.

7. The display apparatus of claim 6, wherein the fifth conductive line includes a plurality of fifth conductive lines and each of the plurality of fifth conductive lines is spaced apart from the first sub driving circuit, the second sub driving circuit, the third sub driving circuit, and the fourth sub driving circuit in the first direction.

8. The display apparatus of claim 6, wherein the first conductive line is electrically connected to the second sub driving circuit.

9. The display apparatus of claim 6, wherein the second conductive line connects the second sub driving circuit to the third sub driving circuit.

10. The display apparatus of claim 6, wherein the third conductive line connects the second sub driving circuit to the fourth sub driving circuit.

11. The display apparatus of claim 6, wherein the fourth conductive line is electrically connected to the first sub driving circuit.

12. The display apparatus of claim 5, further comprising:
a first insulating layer disposed between the first conductive line and the second conductive line;
a second insulating layer disposed between the second conductive line and the third conductive line;
a third insulating layer disposed between the third conductive line and the fourth conductive line; and
a fourth insulating layer disposed between the fourth conductive line and the fifth conductive line.

13. The display apparatus of claim 12, further comprising a planarization layer disposed on the fifth conductive line.

14. The display apparatus of claim 13, further comprising pixels arranged in the display area,
wherein the first conductive line and the fourth conductive line transmit at least one of a scan signal, a previous scan signal, an emission control signal, and an initialization voltage to the pixels.

15. A display apparatus comprising:
a substrate including a display area and a non-display area disposed around the display area;
a driving circuit disposed in the non-display area;
a first conductive line extending in a first direction and disposed in the non-display area;
a second conductive line extending in the first direction and disposed on the first conductive line;
a third conductive line extending in the first direction and disposed on the second conductive line;
a fourth conductive line extending in the first direction and disposed on the third conductive line; and
a fifth conductive line extending in a second direction intersecting the first direction and disposed on the fourth conductive line,
wherein the fifth conductive line extending in the second direction at least partially overlaps the first conductive line, the second conductive line, the third conductive line, and the fourth conductive line all extending in the first direction.

16. The display apparatus of claim 15, wherein the second conductive line includes a first bypass line and a second bypass line both extending by a first length in the second direction and a third bypass line connecting the first bypass line to the second bypass line.

17. The display apparatus of claim 16, wherein the third conductive line includes a fourth bypass line and a fifth bypass line both extending by a second length in the second direction and a sixth bypass line connecting the fourth bypass line to the fifth bypass line, and
the second length is smaller than the first length.

18. The display apparatus of claim 17, wherein the third bypass line and the sixth bypass line at least partially overlap the fifth conductive line.

19. The display apparatus of claim 18, wherein the third bypass line overlaps the first conductive line by a first width and the sixth bypass line is spaced apart from the first conductive line by a first distance.

* * * * *